(12) United States Patent
Xie et al.

(10) Patent No.: US 11,316,049 B2
(45) Date of Patent: Apr. 26, 2022

(54) THIN-FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Huafei Xie, Guangdong (CN); Shujhih Chen, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 703 days.

(21) Appl. No.: 16/094,479

(22) PCT Filed: Sep. 7, 2018

(86) PCT No.: PCT/CN2018/104532
§ 371 (c)(1),
(2) Date: Oct. 18, 2018

(87) PCT Pub. No.: WO2020/006858
PCT Pub. Date: Jan. 9, 2020

(65) Prior Publication Data
US 2021/0226068 A1     Jul. 22, 2021

(30) Foreign Application Priority Data
Jul. 5, 2018   (CN) .......................... 201810728134.3

(51) Int. Cl.
*H01L 29/786* (2006.01)
*H01L 29/66* (2006.01)

(52) U.S. Cl.
CPC .. *H01L 29/78684* (2013.01); *H01L 29/66045* (2013.01); *H01L 29/66068* (2013.01); *H01L 29/66742* (2013.01); *H01L 29/78618* (2013.01)

(58) Field of Classification Search
CPC ......... H01L 29/78684; H01L 29/66045; H01L 29/78618; H01L 29/66068;
(Continued)

(56) References Cited

U.S. PATENT DOCUMENTS 7,411,211 B1* 8/2008 Yamazaki ........... G02F 1/13454
257/59
2006/0066229 A1* 3/2006 Nimura ............... H01L 27/3267
313/506
(Continued)

FOREIGN PATENT DOCUMENTS

CN     101714569 A     5/2010
CN     102655095 A     9/2012
(Continued)

*Primary Examiner* — Shahed Ahmed
(74) *Attorney, Agent, or Firm* — Soroker Agmon Nordman

(57) ABSTRACT

A thin-film transistor and a manufacturing method thereof are provided, and the manufacturing method includes: forming a source electrode, a drain electrode and a planarization layer on a substrate, and patterning the planarization layer to form a first portion disposed between the source electrode and the drain electrode, a second portion disposed at a side of the source drain, and a third portion disposed at a side of the drain electrode. Upper surfaces of all the first portion, the second portion, and the third surface are flush with top portions of both the source electrode and the drain electrode.

12 Claims, 4 Drawing Sheets

(58) Field of Classification Search
CPC . H01L 29/66742–6678; H01L 29/786–78696; H01L 27/12–13; H01L 29/04–045
See application file for complete search history.

(56) References Cited

U.S. PATENT DOCUMENTS

| | | |
|---|---|---|
| 2007/0132023 A1 | 6/2007 | Ahn et al. |
| 2010/0066961 A1* | 3/2010 | Matsui .................. C09K 19/56 349/129 |
| 2011/0227087 A1* | 9/2011 | Moriwaki ........... H01L 27/3265 257/71 |
| 2012/0309136 A1 | 12/2012 | Zhou |
| 2014/0091280 A1* | 4/2014 | Sun .................. H01L 29/66022 257/29 |
| 2014/0312329 A1* | 10/2014 | Fujii .................. H01L 51/5228 257/40 |
| 2016/0267873 A1* | 9/2016 | Saotome ............. G09G 3/3688 |
| 2017/0271381 A1* | 9/2017 | Sone ................ H01L 29/66969 |
| 2018/0190812 A1 | 7/2018 | Shi |
| 2019/0237677 A1 | 8/2019 | Goto et al. |

FOREIGN PATENT DOCUMENTS

| | | |
|---|---|---|
| CN | 105206626 A | 12/2015 |
| WO | 2018061819 A1 | 4/2018 |

* cited by examiner

THIN-FILM TRANSISTOR AND MANUFACTURING METHOD THEREOF

CROSS REFERENCE TO RELATED APPLICATIONS

This application is a U.S. National Phase application submitted under 35 U.S.C. § 371 of Patent Cooperation Treaty Application serial No. PCT/CN2018/104532, filed on Sep. 7, 2018, which claims the priority of China Patent Application serial No. 201810728134.3, filed on Jul. 5, 2018, the disclosures of which are incorporated herein by reference in their entirety.

FIELD OF INVENTION

The present invention relates to field of display technologies, and more particularly to a thin-film transistor and a manufacturing method thereof.

BACKGROUND OF INVENTION

Structure of a current thin-film transistor includes a substrate, a first metal layer (forming a gate electrode), an insulating layer, an active layer, a second metal layer (forming a source drain electrode), and the like. That is, in the current thin-film transistor, a deposition of the second metal layer is performed after the active layer is prepared. Material of the active layer is usually a novel semiconductor material such as graphene, carbon nanotube, silicon carbide, molybdenum disulfide, and organic compounds.

However, because the deposition process of the second metal layer is usually performed by a physical vapor deposition process, the physical vapor deposition process may cause damage to the novel semiconductor material. Moreover, since adhesion of the novel semiconductor material to the metal and glass substrate is limited, performance of the thin-film transistor is reduced when the transistor of the above novel semiconductor material is prepared.

Therefore, it is necessary to provide a thin-film transistor and a manufacturing method thereof to solve problems of the prior art.

SUMMARY OF INVENTION

The object of the present invention provides a thin-film transistor and a manufacturing method thereof to improve the performance of the thin-film transistor.

In order to solve the above technical problems, the present invention provides a manufacturing method of a thin-film transistor, the manufacturing method of a thin-film transistor includes steps of:

forming a first conducting layer on a substrate, and patterning the first conducting layer to form a gate electrode;

forming a gate insulation layer on the gate electrode and the substrate;

forming a second conducting layer on the gate insulation layer, and patterning the second conducting layer to form a source electrode and a drain electrode;

forming a planarization layer on the source electrode, the drain electrode and the gate insulation layer, and etching the planarization layer by a plasma treatment to form a first portion, a second portion, and a third portion; wherein the first portion is disposed between the source electrode and the drain electrode, the second portion is disposed at a side of the source electrode, and the third portion is disposed at a side of the drain electrode; upper surfaces of all the first portion, the second portion, and the third portion are flush with top portions of both the source electrode and the drain electrode so as to expose a portion of both the source electrode and the drain electrode; a material of the planarization layer is a photosensitive insulating resin material;

forming an active layer on the planarization layer, the source electrode and the drain electrode, wherein the active layer is configured to form a channel;

forming a passivation layer on the channel, the second portion, and the third portion.

In the manufacturing method of the thin-film transistor of the present invention, the step of forming the planarization layer on the source electrode, the drain electrode and the gate insulation layer includes:

coating the material of the planarization layer on the source electrode, the drain electrode, and the gate insulation layer;

curing the material of the planarization layer to form the planarization layer.

In the manufacturing method of the thin-film transistor of the present invention, after the step of forming the passivation layer on the channel, the second portion, and the third portion, the manufacturing method further includes:

patterning the passivation layer and the third portion of the planarization layer to obtain a through hole, wherein the through hole passes through the passivation layer and the third portion.

In the manufacturing method of the thin-film transistor of the present invention, the channel is disposed on the first portion, the source electrode, and the drain electrode.

In the manufacturing method of the thin-film transistor of the present invention, a material of the active layer includes at least one of graphene, silicon carbide, molybdenum disulfide, organic semiconductor, and carbon nanotube.

In the manufacturing method of the thin-film transistor of the present invention, a material of the passivation layer includes at least one of organic insulating material, $SiN_x$, $SiO_2$, $HfO_2$, and $Al_2O_3$.

The present invention provides a manufacturing method of a thin-film transistor, the manufacturing method of a thin-film transistor includes steps of: forming a first conducting layer on a substrate, and patterning the first conducting layer to form a gate electrode;

forming a gate insulation layer on the gate electrode and the substrate;

forming a second conducting layer on the gate insulation layer, and patterning the second conducting layer to form a source electrode and a drain electrode;

forming a planarization layer on the source electrode, the drain electrode and the gate insulation layer, and patterning the planarization layer to form a first portion, a second portion, and a third portion, wherein the first portion is disposed between the source electrode and the drain electrode, the second portion is disposed at a side of the source electrode, and the third portion is disposed at a side of the drain electrode; and upper surfaces of all the first portion, the second portion, and the third portion are flush with top portions of both the source electrode and the drain electrode so as to expose a portion of both the source electrode and the drain electrode;

forming an active layer on the planarization layer, the source electrode and the drain electrode, wherein the active layer is configured to form a channel;

forming a passivation layer on the channel, the second portion, and the third portion.

In the manufacturing method of the thin-film transistor of the present invention, a material of the planarization layer is a photosensitive insulating resin material.

In the manufacturing method of the thin-film transistor of the present invention, the step of patterning the planarization layer to form the first portion, the second portion, and the third portion includes:

etching the planarization layer by a plasma treatment to form the first portion, the second portion, and the third portion.

In the manufacturing method of the thin-film transistor of the present invention, the step of forming the planarization layer on the source electrode, the drain electrode and the gate insulation layer includes:

coating a material of the planarization layer on the source electrode, the drain electrode, and the gate insulation layer;

curing the material of the planarization layer to form the planarization layer.

In the manufacturing method of the thin-film transistor of the present invention, after the step of forming the passivation layer on the channel, the second portion, and the third portion, the manufacturing method further includes:

patterning the passivation layer and the third portion of the planarization layer to obtain a through hole, wherein the through hole passes through the passivation layer and the third portion.

In the manufacturing method of the thin-film transistor of the present invention, the channel is disposed on the first portion, the source electrode, and the drain electrode.

In the manufacturing method of the thin-film transistor of the present invention, a material of the active layer includes at least one of graphene, silicon carbide, molybdenum disulfide, organic semiconductor, and carbon nanotube.

In the manufacturing method of the thin-film transistor of the present invention, a material of the passivation layer includes at least one of organic insulating material, $SiN_x$, $SiO_2$, $HfO_2$, and $Al_2O_3$.

The present invention further provides a thin-film transistor, the thin-film transistor includes:

a gate electrode disposed on a substrate;

a gate insulation layer disposed on the gate electrode and the substrate;

a source electrode and a drain electrode disposed on the gate insulation layer;

a planarization layer disposed on the source electrode, the drain electrode, and the gate insulation layer, wherein the planarization layer includes a first portion disposed between the source electrode and the drain electrode, a second portion disposed at a side of the source electrode, and a third portion disposed at a side of the drain electrode, and upper surfaces of all the first portion, the second portion, and the third portion are flush with top portions of both the source electrode and the drain electrode so as to expose a portion of both the source electrode and the drain electrode;

an active layer disposed on the planarization layer, the source electrode, and the drain electrode, wherein the active layer is formed with a channel;

a passivation layer disposed on the channel, the second portion, and the third portion.

In the thin-film transistor of the present invention, a material of the planarization layer is a photosensitive insulating resin material.

In the thin-film transistor of the present invention, a through hole is disposed in the passivation layer, and the through hole passes through the passivation layer and the third portion.

In the thin-film transistor of the present invention, the channel is disposed on the first portion, the source electrode, and the drain electrode.

In the thin-film transistor of the present invention, a material of the active layer includes at least one of graphene, silicon carbide, molybdenum disulfide, organic semiconductor, and carbon nanotube.

In the thin-film transistor of the present invention, a material of the passivation layer includes at least one of organic insulating material, $SiN_x$, $SiO_2$, $HfO_2$, and $Al_2O_3$.

The thin-film transistor of the present invention and the manufacturing method thereof prevent the damage of the channel material by the deposition process of the second conducting layer by fabricating the active layer after the second conducting layer. At the same time, the planarization layer is added between the second conducting layer and the active layer to enhance the adhesion between the active layer and the underlying layer, so as to improve the performance of the thin-film transistor.

DETAILED DESCRIPTION OF PREFERRED EMBODIMENTS

Figure 1:
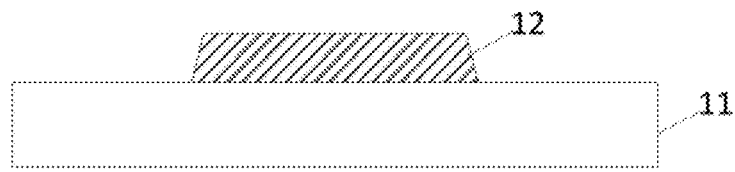
FIG. 1 is a schematic structural view of a first step of a manufacturing method of a thin-film transistor of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", 'side', etc., is used with reference to the orientation of the figure(s) being described. As such, the directional terminology is used for purposes of illustration and is in no way limiting. Throughout this specification and in the drawings like parts will be referred to by the same reference numerals.

Please refer to FIG. 1, FIG. 1 is a schematic structural view of a first step of a manufacturing method of a thin-film transistor of the present invention.

As shown in FIG. 1, a manufacturing method of the manufacturing method of a thin-film transistor of the present invention mainly includes steps of:

S101, forming a first conducting layer on a substrate, and patterning the first conducting layer to form a gate electrode;

As shown in FIG. 1, specifically, the substrate 11 (base) is cleaned first, and then an entire layer of conductive layer is deposited on the substrate 11 by physical vapor deposition (PVD) or evaporation. A photoresist, a photomask, etc. is coated on the conductive layer, and then a photolithography process such as exposure, development, acid wet etching, and elution is performed to pattern the conductive layer to obtain a gate electrode 12.

The material of the substrate 11 may be polyimide (PI), polyethylene terephthalate (PET), quartz, $SiO_2$, glass or the like. The material of the first conducting layer is indium tin oxide (ITO), Mo/Al, Ti/Cu, Cr/Au, Ag, or the like.

Figure 2:
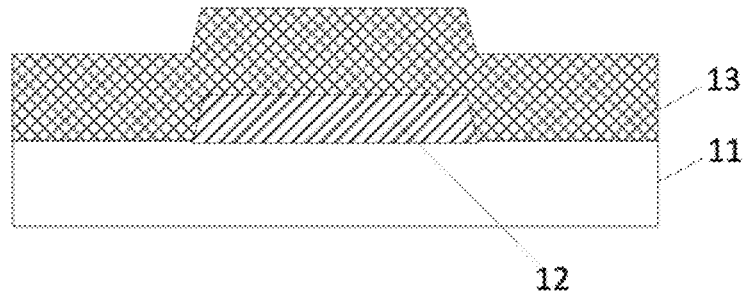
FIG. 2 is a schematic structural view of a second step of a manufacturing method of a thin-film transistor of the present invention.

S102, forming a gate insulation layer on the gate electrode and the substrate;

As shown in FIG. 2, an entire layer of gate insulation layer 13 (GI) is prepared on the gate electrode 12 by atomic layer deposition (ALD) or chemical vapor deposition (CVD). The material of the gate insulation layer 13 may be an organic insulating material, $SiN_x$, $SiO_2$, $HfO_2$, and $Al_2O_3$ or the like.

Figure 3:
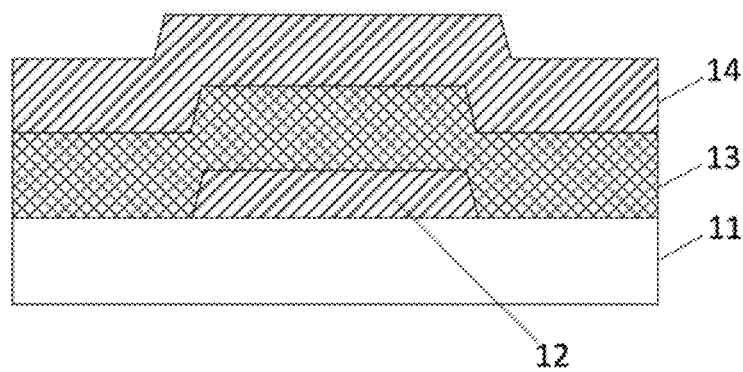
FIG. 3 is a schematic structural view of a first substep in a third step of a manufacturing method of a thin-film transistor of the present invention.
Figure 4:
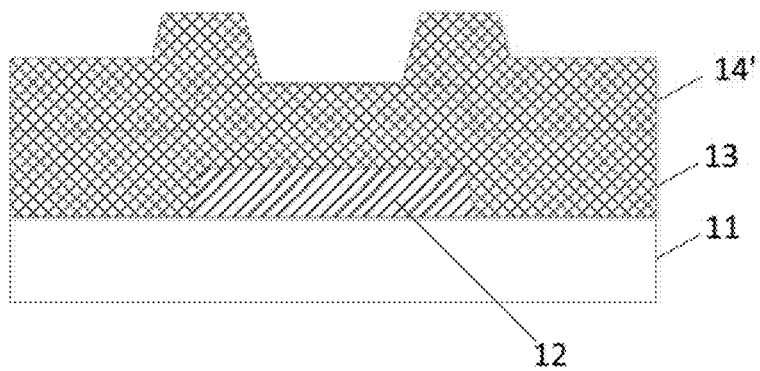
FIG. 4 is a schematic structural view of a second substep in a third step of a manufacturing method of a thin-film transistor of the present invention.

S103, forming a second conducting layer on the gate insulation layer, and patterning the second conducting layer to form a source electrode and a drain electrode;

As shown in FIG. 3, an entire layer of conductive layer 14 is deposited on the gate insulation layer 13 by physical vapor deposition (PVD) or evaporation. Then a photoresist is coated on the conductive layer 14, and subjected to exposure, development, acid wet etching, and elution of the photoresist, a patterned source drain electrode 14' (S/D) is obtained, as shown in FIG. 4. The material of the second conducting layer 14 is ITO, Mo/Al, Ti/Cu, Cr/Au, Ag, or the like.

Figure 5:
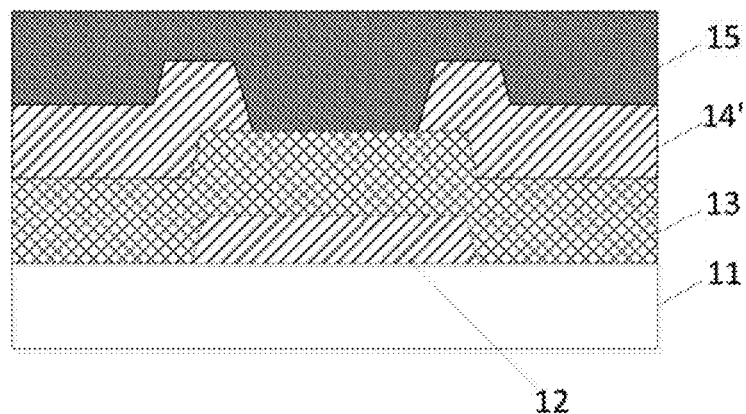
FIG. 5 is a schematic structural view of a first substep in a fourth step of a manufacturing method of a thin-film transistor of the present invention.

S104, forming a planarization layer on the source electrode, the drain electrode and the gate insulation layer, and etching the planarization layer by a plasma treatment to form a first portion, a second portion, and a third portion. The first portion is disposed between the source electrode and the drain electrode, the second portion is disposed at a side of the source electrode, and the third portion is disposed at a side of the drain electrode; upper surfaces of all the first portion, the second portion, and the third portion are flush with top portions of both the source electrode and the drain electrode so as to expose a portion of both the source electrode and the drain electrode;

The step may include:

S1041, coating the material of the planarization layer on the source electrode, the drain electrode, and the gate insulation layer;

S1042, curing the material of the planarization layer to form the planarization layer;

For example, as shown in FIG. 5, the material of the entire layer of planarization layer is coated on the source drain electrode 14' and the gate insulation layer 13. The material of the planarization layer is then pre-baked, exposed, developed, bleached, baked, etc. to cure the organic material to form a planarization layer 15.

Figure 6:
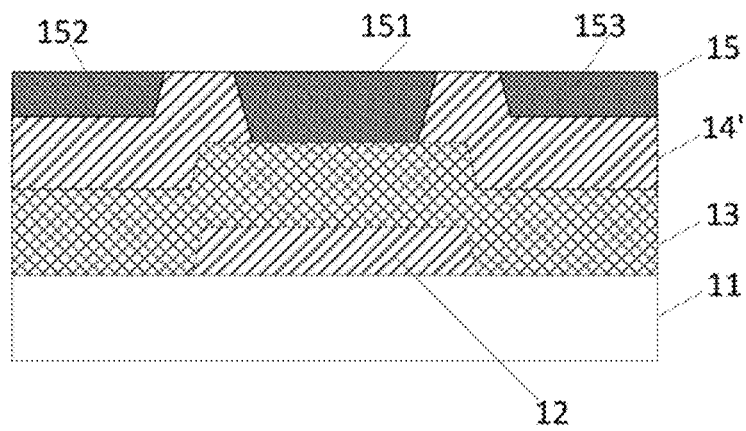
FIG. 6 is a schematic structural view of a second substep in a fourth step of a manufacturing method of a thin-film transistor of the present invention.

S1043, patterning the planarization layer to form a first portion, a second portion, and a third portion;

As shown in FIG. 6, the planarization layer 15 is dry-etched by plasma treatment to form a first portion 151, a second portion 152, and a third portion 153. The first portion 151 is disposed between the source electrode and the drain electrode, the second portion 152 is disposed on a side of the source electrode, and the third portion 153 is disposed on a side of the drain electrode. Upper surfaces of all the first portion 151, the second portion 152, and the third portion 153 are flush with top portions of both the source electrode and the drain electrode. That is, the upper surface of the patterned planarization layer 15 (the surface away from the second conducting layer) is flush with the top portions of the source drain electrode 14' (the middle raised portion in the figure). Thereby, a portion of the source drain electrode 14' (the middle raised portion in the figure) is exposed and facilitate connection with an active layer.

Preferably, in order to further enhance the adhesion of the active layer to the film layer under the active layer, the material of the planarization layer 15 is a photosensitive insulating resin material, such as a negative photosensitive insulating resin material or a positive photosensitive insulating resin material. That is, the adhesion between the active layer 16 and the second conducting layer 14 is enhanced by the planarization layer 15.

S105, forming an active layer on the planarization layer, the source electrode and the drain electrode, the active layer is configured to form a channel.

Figure 7:
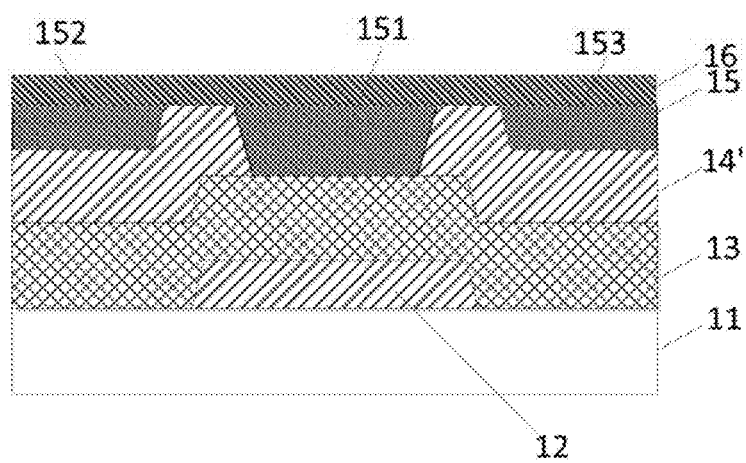
FIG. 7 is a schematic structural view of a first substep in a fifth step of a manufacturing method of a thin-film transistor of the present invention.
Figure 8:
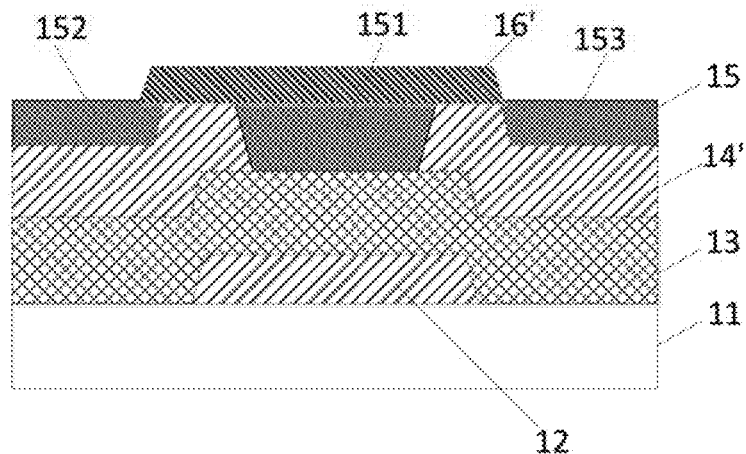
FIG. 8 is a schematic structural view of a second substep in a fifth step of a manufacturing method of a thin-film transistor of the present invention.

For example, as shown in FIG. 7, the active layer 16 is formed on the upper surface of the etched planarization layer 15 and the source drain electrode 14' by a solution process or a transfer process. Then, a photoresist is coated on the active layer 16, and a mask exposure, development, plasma dry etching, elution of photoresist, and the like are performed to pattern the active layer 16 to obtain a channel 16'. The channel 16' is disposed on the first portion 151 and the source electrode and the drain electrode.

The material of the active layer 16 includes at least one of graphene, silicon carbide (SiC), molybdenum disulfide ($MoS_2$), organic semiconductor, and carbon nanotube.

S106, forming a passivation layer on the channel 16', the second portion 152, and the third portion 153.

Figure 9:
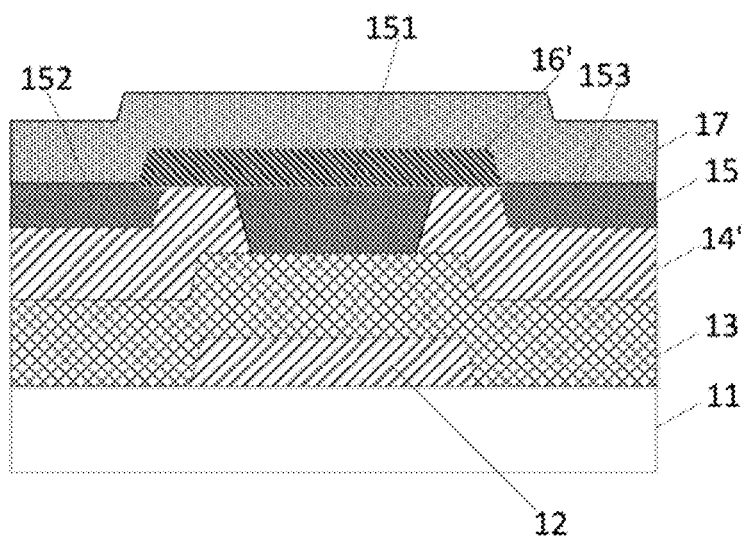
FIG. 9 is a schematic structural view of a sixth step of a manufacturing method of a thin-film transistor of the present invention.

As shown in FIG. 9, an entire layer of passivation film is formed over the channel 16' by atomic layer deposition (ALD) or chemical vapor deposition (CVD), and the passivation film is patterned by a photolithography process such as photoresist coating, exposure, development, plasma dry etching, and elution to obtain a passivation layer 17.

The material of the passivation layer 17 includes at least one of organic insulating material, $SiN_x$, $SiO_2$, $HfO_2$, and $Al_2O_3$.

S107, patterning the passivation layer and the third portion of the planarization layer to obtain a through hole, the through hole passes through the passivation layer and the third portion.

Figure 10:
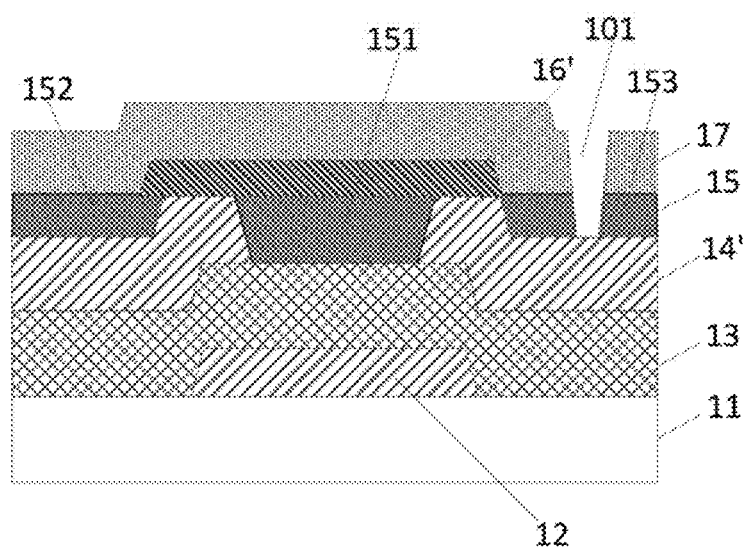
FIG. 10 is a schematic structural view of a seven step of a manufacturing method of a thin-film transistor of the present invention.

As shown in FIG. 10, the passivation layer 17 and the third portion 153 are patterned using a mask to obtain a through hole 101. The through hole 101 extends from the passivation layer 17 to the third portion 153 of the planarization layer. Wherein the position of the through hole 101 corresponds to the position of the drain electrode. The drain electrode is connected to the pixel electrode through the through hole 101.

Referring to FIG. 1 to FIG. 10, this embodiment provides a thin-film transistor. The thin-film transistor includes a first conducting layer, a gate insulation layer 13, a second conducting layer 14, a planarization layer 15, an active layer 16, and a passivation layer 17 are sequentially disposed on a substrate 11.

The material of the substrate 11 may be polyimide (PI), polyethylene terephthalate (PET), quartz, $SiO_2$, glass or the like. The first conducting layer is disposed on the substrate 11, and the first conducting layer includes a gate electrode 12. The material of the first conducting layer is indium tin oxide (ITO), Mo/Al, Ti/Cu, Cr/Au, Ag, or the like.

The gate insulation layer 13 is disposed on the gate electrode 12. The material of the gate insulation layer 13 may be an organic insulating material, $SiN_x$, $SiO_2$, $HfO_2$, and $Al_2O_3$ or the like.

The second conducting layer is disposed on the gate insulation layer 13, and the second conducting layer includes a source drain electrode 14'. The material of the second conducting layer is indium tin oxide (ITO), Mo/Al, Ti/Cu, Cr/Au, Ag, or the like.

The planarization layer 15 is disposed on the source drain electrode 14' and the gate insulation layer 13. The planarization layer 15 includes a first portion 151 disposed between the source electrode and the drain electrode, a second portion 152 disposed on a side of the source electrode, and a third portion 153 of a side of the drain electrode. Upper surfaces of all the first portion 151, the second portion 152, and the third portion 153 are flush with top portions of both the source electrode and the drain electrode so as to expose a portion of both the source electrode and the drain electrode.

Wherein the upper surface of the etched planarization layer 15 is flush with the top portion of the source drain electrode 14' by patterning the material of the planarization layer coated on the source drain electrode 14'.

In order to further enhance the adhesion of the active layer to the film layer under the active layer, the material of the planarization layer 15 is a photosensitive insulating resin material, such as a negative photosensitive insulating resin material or a positive photosensitive insulating resin material. That is, the adhesion between the active layer 16 and the second conducting layer 14 is enhanced by the planarization layer 15.

The planarization layer 15 is configured to enhance adhesion between the active layer and the second conducting layer.

The active layer is disposed on the etched planarization layer 15 and the source drain electrode 14', and the active layer is configured to form a channel 16'. The material of the active layer is graphene, silicon carbide, molybdenum disulfide, organic semiconductor, carbon nanotube, or the like.

The passivation layer 17 is disposed on the channel 16' and the second portion 152, and the third portion 153. A through hole 101 is disposed in the passivation layer 17, and the through hole 101 passes through the passivation layer 17 and the third portion 153. The through hole 101 is configured to connect the drain electrode and the pixel electrode. The material of the passivation layer 17 is organic insulating material, $SiN_x$, $SiO_2$, $HfO_2$, and $Al_2O_3$.

The thin-film transistor of the present invention and the manufacturing method thereof prevent the damage of the channel material by the deposition process of the second conducting layer by fabricating the active layer after the second conducting layer. At the same time, the planarization layer is added between the second conducting layer and the active layer to enhance the adhesion between the active layer and the underlying layer, so as to improve the performance of the thin-film transistor.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A manufacturing method of a thin-film transistor, comprising steps of:
    forming a first conducting layer on a substrate, and patterning the first conducting layer to form a gate electrode;
    forming a gate insulation layer on the gate electrode and the substrate;
    forming a second conducting layer on the gate insulation layer, and patterning the second conducting layer to form a source electrode and a drain electrode;
    forming a planarization layer on the source electrode, the drain electrode and the gate insulation layer, and etching the planarization layer by a plasma treatment to form a first portion, a second portion, and a third portion, wherein the first portion is formed on the gate insulation layer and is disposed between the source electrode and the drain electrode, the second portion is formed on the source electrode and is disposed at a side of the source electrode, and the third portion is formed on the drain electrode and is disposed at a side of the drain electrode; upper surfaces of all the first portion, the second portion, and the third portion are flush with top portions of both the source electrode and the drain electrode so as to expose a portion of both the source electrode and the drain electrode; and a material of the planarization layer is a photosensitive insulating resin material;
    forming an active layer on the planarization layer, the source electrode and the drain electrode, wherein the active layer is configured to form a channel, and wherein a material of the active layer comprises at least one of graphene, silicon carbide, molybdenum disulfide, organic semiconductor, and carbon nanotube; and
    forming a passivation layer on the channel, the second portion, and the third portion.

2. The manufacturing method of the thin-film transistor according to claim 1, wherein the step of forming the planarization layer on the source electrode, the drain electrode and the gate insulation layer comprises:
    coating the material of the planarization layer on the source electrode, the drain electrode, and the gate insulation layer; and
    curing the material of the planarization layer to form the planarization layer.

3. The manufacturing method of the thin-film transistor according to claim 1, wherein after the step of forming the passivation layer on the channel, the second portion, and the third portion, the manufacturing method further comprises:
    patterning the passivation layer and the third portion of the planarization layer to obtain a through hole, wherein the through hole passes through the passivation layer and the third portion.

4. The manufacturing method of the thin-film transistor according to claim 1, wherein the channel is disposed on the first portion, the source electrode, and the drain electrode.

5. The manufacturing method of the thin-film transistor according to claim 1, wherein a material of the passivation layer comprises at least one of organic insulating material, SiNx, SiO2, HfO2, and Al2O3.

6. A manufacturing method of a thin-film transistor, comprising steps of:
- forming a first conducting layer on a substrate, and patterning the first conducting layer to form a gate electrode;
- forming a gate insulation layer on the gate electrode and the substrate;
- forming a second conducting layer on the gate insulation layer, and patterning the second conducting layer to form a source electrode and a drain electrode;
- forming a planarization layer on the source electrode, the drain electrode and the gate insulation layer, and patterning the planarization layer to form a first portion, a second portion, and a third portion, wherein the first portion is formed on the gate insulation layer and is disposed between the source electrode and the drain electrode, the second portion is formed on the source electrode and is disposed at a side of the source electrode, and the third portion is formed on the drain electrode and is disposed at a side of the drain electrode; and upper surfaces of all the first portion, the second portion, and the third portion are flush with top portions of both the source electrode and the drain electrode so as to expose a portion of both the source electrode and the drain electrode;
- forming an active layer on the planarization layer, the source electrode and the drain electrode, wherein the active layer is configured to form a channel, and wherein a material of the active layer comprises at least one of graphene, silicon carbide, molybdenum disulfide, organic semiconductor, and carbon nanotube; and
- forming a passivation layer on the channel, the second portion, and the third portion.

7. The manufacturing method of the thin-film transistor according to claim 6, wherein a material of the planarization layer is a photosensitive insulating resin material.

8. The manufacturing method of the thin-film transistor according to claim 6, wherein the step of patterning the planarization layer to form the first portion, the second portion, and the third portion comprises:
- etching the planarization layer by a plasma treatment to form the first portion, the second portion, and the third portion.

9. The manufacturing method of the thin-film transistor according to claim 6, wherein the step of forming the planarization layer on the source electrode, the drain electrode and the gate insulation layer comprises:
- coating a material of the planarization layer on the source electrode, the drain electrode, and the gate insulation layer; and
- curing the material of the planarization layer to form the planarization layer.

10. The manufacturing method of the thin-film transistor according to claim 6, wherein after the step of forming the passivation layer on the channel, the second portion, and the third portion, the manufacturing method further comprises:
- patterning the passivation layer and the third portion of the planarization layer to obtain a through hole, wherein the through hole passes through the passivation layer and the third portion.

11. The manufacturing method of the thin-film transistor according to claim 6, wherein the channel is disposed on the first portion, the source electrode, and the drain electrode.

12. The manufacturing method of the thin-film transistor according to claim 6, wherein a material of the passivation layer comprises at least one of organic insulating material, $SiN_x$, $SiO_2$, $H_1O_2$, and $Al_2O_3$.

* * * * *